United States Patent
Kim et al.

(10) Patent No.: US 6,999,359 B2
(45) Date of Patent: Feb. 14, 2006

(54) METHOD FOR SCREENING FAILURE OF MEMORY CELL TRANSISTOR

(75) Inventors: Young Soo Kim, Kyoungki-do (KR); Jung Hoon Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 77 days.

(21) Appl. No.: 10/850,622

(22) Filed: May 21, 2004

(65) Prior Publication Data

US 2005/0201166 A1    Sep. 15, 2005

(30) Foreign Application Priority Data

Mar. 11, 2004   (KR) ...................... 10-2004-0016575

(51) Int. Cl.
G11C 29/00    (2006.01)
(52) U.S. Cl. ...................... 365/200; 365/201; 365/205
(58) Field of Classification Search ................ 365/200, 365/201, 205

See application file for complete search history.

(56) References Cited

U.S. PATENT DOCUMENTS 5,373,472 A * 12/1994 Ohsawa ...................... 365/201
6,901,014 B1 * 5/2005 Son et al. .................... 365/200

* cited by examiner

*Primary Examiner*—Huan Hoang
(74) *Attorney, Agent, or Firm*—Ladas & Parry LLP

(57) ABSTRACT

The present invention discloses a method for screening a sensing margin generated by a gate residue in a memory cell transistor. The method for screening failure of the memory cell transistor is summarized as follows. A test mode signal for sensing margin control is supplied. A write operation is performed to store data in the cell transistor. A word line is enabled by an active command. Isolated transistors disposed between a bit line coupled to the cell transistor and a bit line coupled to a sense amplifier are disabled to intercept a sensing operation. A voltage of the bit line coupled to the cell transistor is measured for a predetermined time. Here, voltage variations on the bit line are measured to screen failure of the cell transistor.

7 Claims, 2 Drawing Sheets

METHOD FOR SCREENING FAILURE OF MEMORY CELL TRANSISTOR

BACKGROUND OF THE INVENTION

1. Field of the Invention

The present invention relates to a method for measuring a sensing margin of a sense amplifier for a memory device, and more particularly to, a method for measuring a sensing margin generated by a gate residue in a memory cell transistor.

2. Description of the Related Art

In general, high speed memory devices including DDR, DDR2 and DDR3 SDRAM use a transistor having a low threshold voltage to satisfy speed-related specifications such as tRCD, tRP and tAA.

Especially, the transistor having the low threshold voltage is employed for a sense amplifier directly relating to a read operation and peripheral transistors.

However, when the transistor having the low threshold voltage is used, if a test mode for sensing margin control tm_smc which is a test mode for screening a gate residue of the transistor during the manufacturing process is executed, a breakdown is generated in the transistors composing the sense amplifier before the gate residue is screened. It is thus difficult to normally screen the gate residue.

The test mode for sensing margin control tm_smc will now be explained in detail with reference to FIG. 1.

FIG. 1 is a circuit diagram illustrating bit lines, a sense amplifier and peripheral circuits of a general memory device.

The test mode for sensing margin control tm_smc measures a sharing time of effective charges stored in a capacitor C11 of a cell transistor TR13 turned on by a word line WL and transmitted to a bit line BIT. When sharing of the charges occurs, a voltage of the bit line BIT is VBLP-ΔV and a voltage of an inverted bit line /BIT is VBLP. Here, VBLP denotes a bit line precharge voltage, and ΔV denotes a minute voltage difference generated by charge sharing.

If a bridge is formed between the bit line BIT and a gate (namely, 'a' region) due to a gate residue generated on the cell transistor TR13 during the manufacturing process, a high voltage of the word line WL is transmitted to the bit line BTL through the cell transistor TR13, to offset effects of the minute voltage difference ΔV generated by charge sharing. As a result, failure of the cell transistor TR13 can be screened in the test mode for sensing margin control tm_smc.

However, in the test mode for sensing margin control tm_smc, isolated transistors TR11 and TR12 are turned on. Accordingly, the bit lines are coupled to the sense amplifier, so that characteristics of the transistors for the sense amplifier may influence on the screening results of the test mode for sensing margin control tm_smc.

For example, when the transistor having a low breakdown voltage is used for the sense amplifier, the bit line BIT and the inverted bit line /BIT are electrically connected through the transistors composing the sense amplifier. In this case, failure of the cell transistor TR13 cannot be normally screened.

SUMMARY OF THE INVENTION

Accordingly, the present invention has been made in an effort to solve the problems occurring in the related art, and an object of the present invention is to provide a method for precisely screening failure of a cell transistor by turning off isolated transistors in a test mode for sensing margin control.

In order to achieve the above object, according to one aspect of the present invention, there is provided a method for screening failure of a memory cell transistor for a memory device, including the steps of: (s1) enabling a word line coupled to the memory cell transistor; (s2) disabling isolated transistors disposed between a first bit line on which the memory cell transistor is positioned and a second bit line on which the sense amplifier is positioned; and (s3) screening voltage variations on the first bit line for a predetermined time.

When a first control signal for enabling the word line and a test mode signal for screening failure of the memory cell transistor are enabled at the same time, the isolated transistors are disabled.

BRIEF DESCRIPTION OF THE DRAWINGS

The above objects, and other features and advantages of the present invention will become more apparent after a reading of the following detailed description when taken in conjunction with the drawings, in which.

DETAILED DESCRIPTION OF PREFERRED EMBODIMENTS

Figure 1:
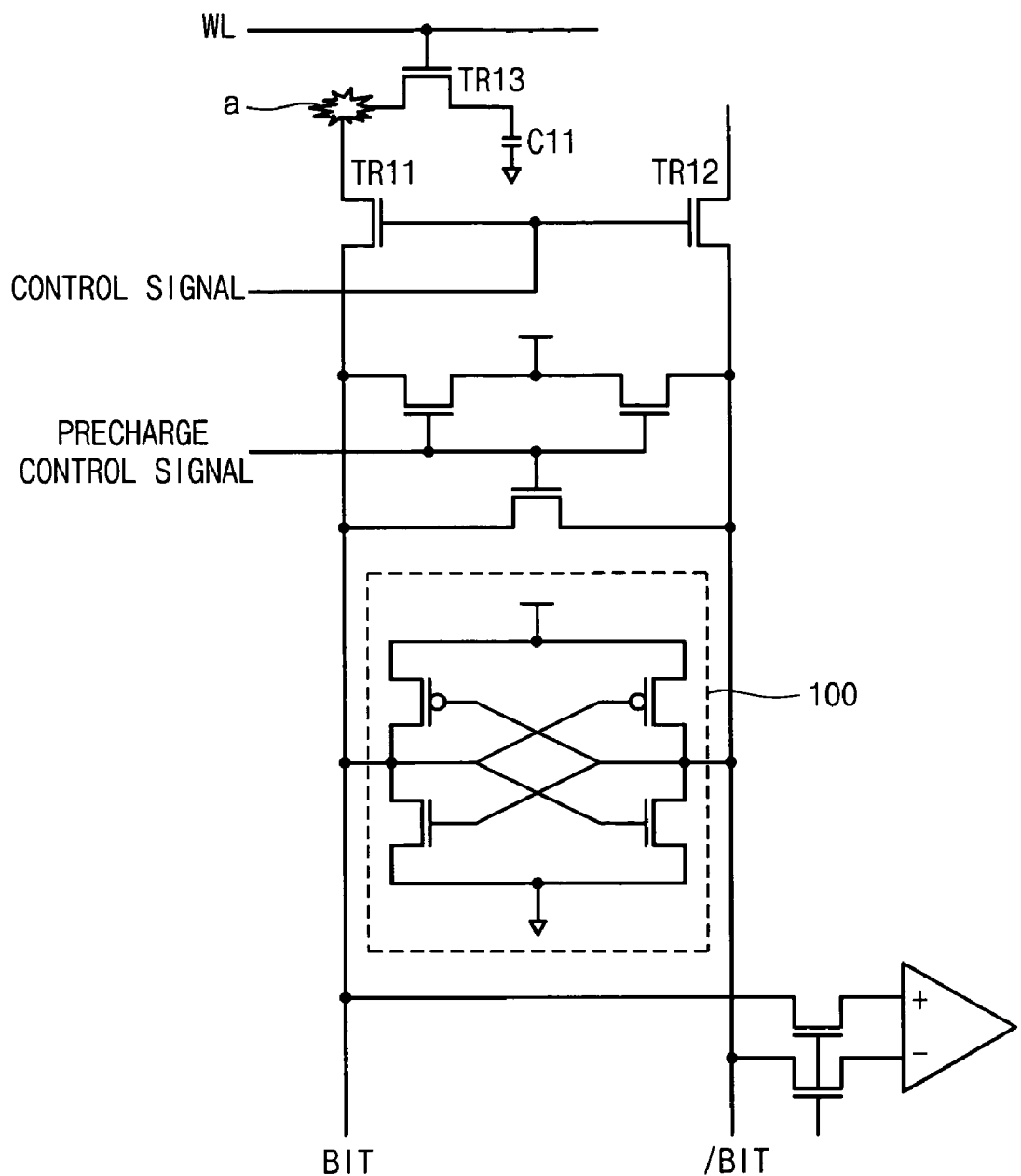
FIG. 1 is a circuit diagram illustrating peripheral circuits of a general memory cell transistor.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2:
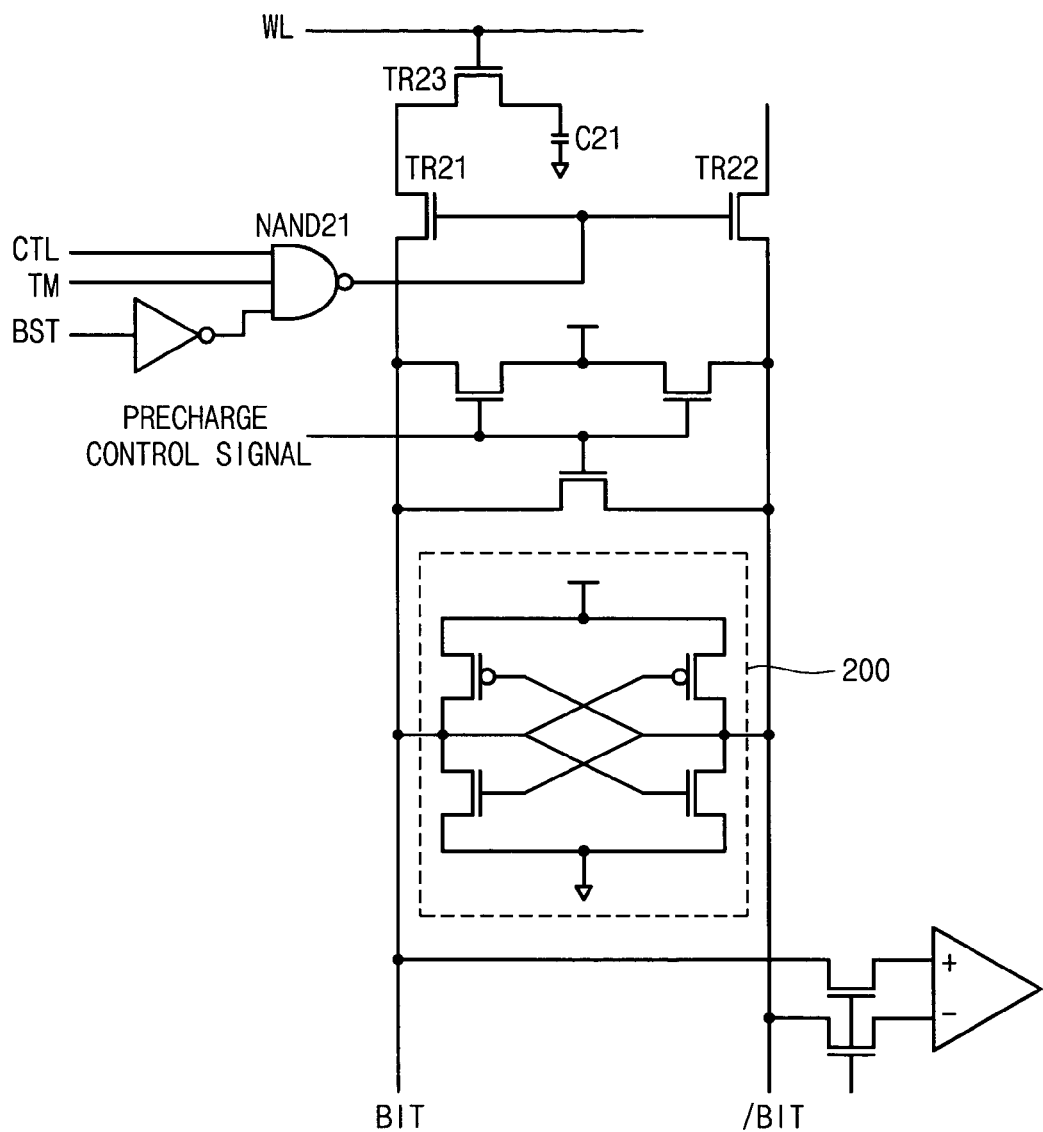
FIG. 2 is a circuit diagram illustrating peripheral circuits of a memory cell transistor for explaining a method for screening failure of the memory cell transistor in accordance with the present invention.

FIG. 2 is a circuit diagram illustrating peripheral circuits of a memory cell transistor for explaining a method for screening failure of the memory cell transistor in accordance with the present invention.

The circuit of FIG. 2 is identical to the circuit of FIG. 1 except for a NAND gate NAND21 which is a control means for controlling the operation of isolated transistors TR21 and TR22.

As illustrated in FIG. 2, TM supplied to the NAND gate NAND21 denotes a test mode signal for sensing margin control tm_smc, CTR denotes a control signal enabled by an active command, and BST denotes a burst stop signal. The BST signal ends a burst operation in a normal mode, and enables a sense amplifier to perform a sensing operation by controlling a turn-on time of the isolated transistors TR21 and TR22 in a test mode.

In accordance with the present invention, the method for screening failure of the memory cell transistor is executed according to the test mode signal inputted after a predetermined time from power-up and MRS sequence. The test mode signal means the test mode for sensing margin control tm_smc described above. The TM signal supplied to the NAND gate NAND21 for controlling gates of the isolated transistors TR21 and TR22 denotes the test mode signal for sensing margin control tm_smc. In the test mode, the TM signal is transited to a high level.

Thereafter, data are stored in the memory cells TR23 and C21 according to a write operation. The isolated transistors TR21 and TR22 and sensing starting are controlled by adjusting the BST signal during the write operation. When the write operation is ended, the BST signal is disabled at a low level.

The word line WL is enabled by the active command. Here, the control signal CTL generated by the active command is transited to a high level. Because the BST signal maintains a low level, the output from the NAND gate NAND21 is transited to a low level. Therefore, the isolated transistors TR21 and TR22 are turned off. As a result, a bit line on which the memory cell transistor TR23 is positioned and a bit line on which the sense amplifier is positioned are not electrically connected by the isolated transistors TR21 and TR22.

A charge sharing time (namely, sensing margin time) between the bit line BIT coupled to the cell transistor TR23 and charges stored in the capacitor C21 of the cell transistor TR23 is controlled, to screen failure of the cell transistor TR23.

When the cell transistor TR23 has failure, a high voltage supplied to the word line WL is transmitted to the bit line BTL through the cell transistor TR23, to rise a voltage of the bit line BTL. Accordingly, the user can decide failure of the cell transistor TR23.

In order to perform the sensing operation by the sense amplifier, the isolated transistors TR21 and TR22 are turned on by transiting the BST signal to a high level, and amplified data are read by starting the sensing operation.

The method for screening failure of the cell transistor will now be summarized.

First, the test mode signal for sensing margin control is supplied.

Second, the write operation is performed to store data in the cell transistor.

Third, the word line is enabled by the active command.

Fourth, the isolated transistors disposed between the bit line coupled to the cell transistor and the bit line coupled to the sense amplifier are disabled to intercept the sensing operation.

Fifth, the voltage of the bit line coupled to the cell transistor is measured for a predetermined time. Here, voltage variations on the bit line are measured to screen failure of the cell transistor.

Sixth, the sensing operation is performed by the sense amplifier by turning on the isolated transistors.

As apparent from the above description, the present invention provides the method for precisely screening failure of the cell transistor by turning off the isolated transistors in the test mode.

Furthermore, the method for screening failure of the memory cell transistor can be applied to a next-generation memory device using a low threshold voltage transistor for high speed operation.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for screening failure of a memory cell transistor for a memory device, comprising the steps of:
   (s1) enabling a word line coupled to the memory cell transistor;
   (s2) disabling isolated transistors disposed between a first bit line on which the memory cell transistor is positioned and a second bit line on which the sense amplifier is positioned; and
   (s3) screening voltage variations on the first bit line for a predetermined time.

2. The method of claim 1, wherein, when a first control signal for enabling the word line and a test mode signal for screening failure of the memory cell transistor are enabled at the same time, the isolated transistors are disabled.

3. The method of claim 1, further comprising the step of:
   (s4) enabling the sense amplifier to perform a turn-on operation by turning on the isolated transistors.

4. A method for screening failure of a memory cell transistor for a memory device, comprising the steps of:
   (s1) supplying a test mode signal;
   (s2) enabling a word line coupled to the memory cell transistor;
   (s3) disabling isolated transistors disposed between a first bit line on which the memory cell transistor is positioned and a second bit line on which the sense amplifier is positioned; and
   (s4) screening voltage variations on the first bit line for a predetermined time.

5. The method of claim 4, further comprising the step of:
   (s5) enabling the sense amplifier to perform a turn-on operation by turning on the isolated transistors.

6. A method for screening failure of a memory cell transistor, comprising the steps of:
   (s1) supplying a test mode signal for sensing margin control;
   (s2) performing a write operation to store data in the cell transistor;
   (s3) enabling a word line by an active command;
   (s4) disabling isolated transistors disposed between a bit line coupled to the cell transistor and a bit line coupled to the sense amplifier; and
   (s5) measuring a voltage of the bit line coupled to the cell transistor for a predetermined time.

7. The method of claim 6, further comprising the step of:
   (s6) enabling the sense amplifier to perform a turn-on operation by turning on the isolated transistors.

* * * * *